(12) United States Patent
Reimann

(10) Patent No.: US 6,203,083 B1
(45) Date of Patent: Mar. 20, 2001

(54) SUCKING PIPETTE FOR PICKING UP ELECTRIC COMPONENTS

(75) Inventor: Günter Reimann, München (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/355,584

(22) PCT Filed: Jan. 21, 1998

(86) PCT No.: PCT/DE98/00179

§ 371 Date: Jul. 29, 1999

§ 102(e) Date: Jul. 29, 1999

(87) PCT Pub. No.: WO98/34453

PCT Pub. Date: Aug. 6, 1998

(30) Foreign Application Priority Data

Jan. 30, 1997 (DE) ............................................. 197 03 402

(51) Int. Cl.[7] ................................ B25J 15/06; B66C 1/02
(52) U.S. Cl. ............................................................ 294/64.1
(58) Field of Search .................................. 294/64.1, 64.2, 294/64.3, 2; 901/40; 29/743; 269/21

(56) References Cited

U.S. PATENT DOCUMENTS

| | | | |
|---|---|---|---|
| 4,795,548 | 1/1989 | Meinel et al. . | |
| 4,799,722 | * 1/1989 | Marzinotto | 294/64.1 |
| 4,828,304 | * 5/1989 | No et al. | 294/64.1 |
| 4,925,225 | * 5/1990 | Dost | 294/64.1 |
| 5,125,152 | 6/1992 | Grasmueller et al. . | |
| 5,685,513 | * 11/1997 | Tsukushi | 294/64.1 |
| 5,882,055 | * 3/1999 | Smith | 294/64.1 |

FOREIGN PATENT DOCUMENTS

| | | | |
|---|---|---|---|
| 1196336 | * 7/1965 | (DE) | 294/64.1 |
| 94 06 244 | 10/1994 | (DE) . | |
| 0 277 731 | 8/1988 | (EP) . | |
| 1230461 | * 9/1960 | (FR) | 294/64.1 |
| 2248221 | * 4/1992 | (GB) | 294/64.1 |

OTHER PUBLICATIONS

Patent Abstract of Japan for Japanese 04 007900 of Jan. 13, 1992.

* cited by examiner

Primary Examiner—Dean J. Kramer
(74) Attorney, Agent, or Firm—Schiff Hardin & Waite

(57) ABSTRACT

The end side of the pipette has an elastomeric bearing member which is cast into grooves, is provided with a think, continuous circular bearing rib (10) and projects slightly beyond the pipette. As a result, the component is sucked on securely and fixed with sufficient accuracy when mounting components on a printed circuit board.

12 Claims, 1 Drawing Sheet

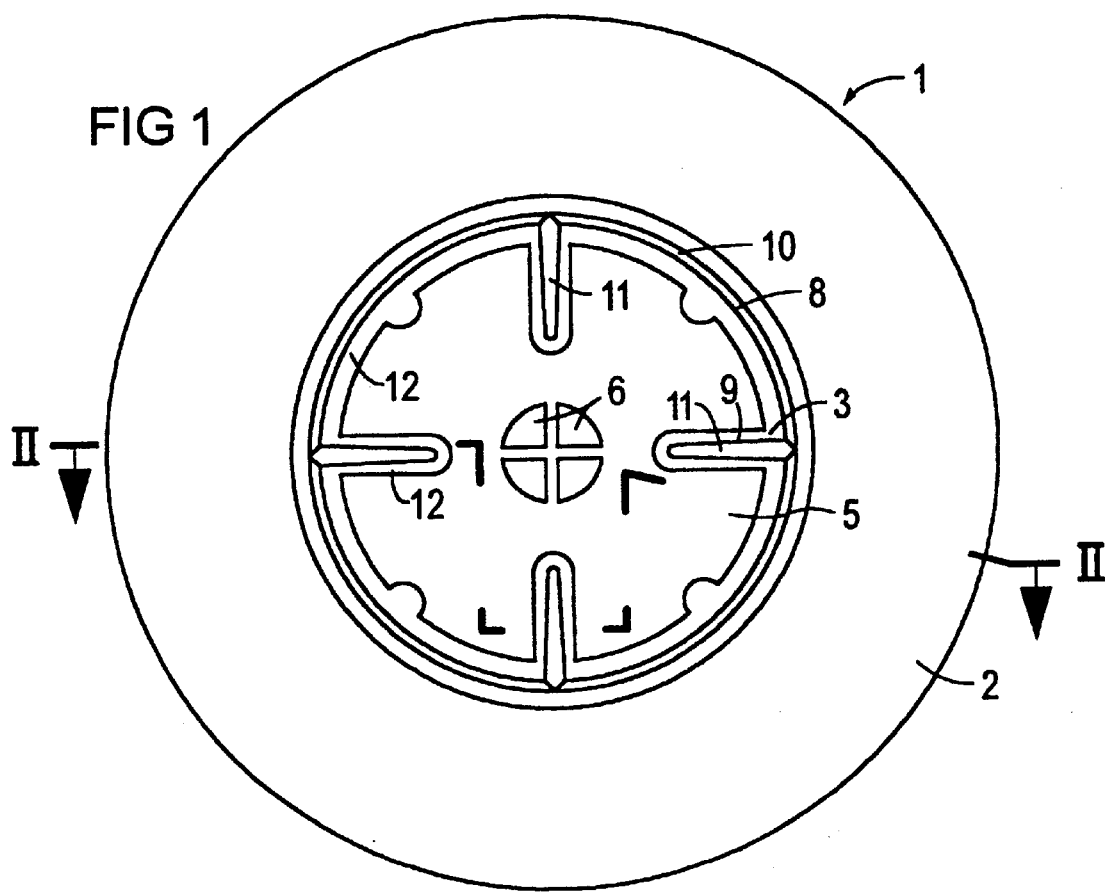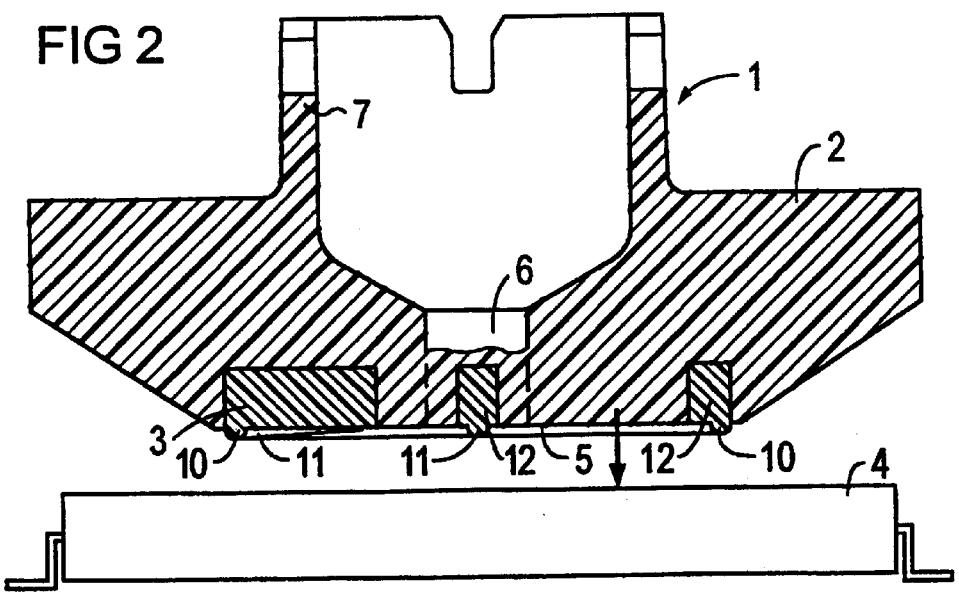

SUCKING PIPETTE FOR PICKING UP ELECTRIC COMPONENTS

BACKGROUND OF THE INVENTION

The invention relates to a pipette for gripping components by means of a vacuum, in particular when mounting components on printed circuit boards.

A pipette of this nature is known, for example, from German utility mode 94 06 244. According to this document, the pipette has a suction opening on its end surface or side which faces toward the component. The component can be sucked onto a bearing surface, which surrounds the suction opening, of the end side. The bearing surface forms part of an elastomeric bearing member which is inserted into the end side of a base body of the pipette and which projects slightly beyond the end side. The bearing member is designed as an O-ring which bears with a press fit against the inner wall of the base body. The O-ring improves the suction ability of the pipette, since it rests more securely against the surface of the component which has been sucked on than does a hard component.

Mounting of components on printed circuit boards increasingly involves the use of mounting machines which have a movable revolver head which accommodates, stores and transports the components, rotates them to their desired installation position, adjusts their position and deposits them on the printed circuit board. The various movement operations result in accelerations which are such that there is a risk of the position of the component changing with respect to the pipette. However the permissible position deviation is so small that such a change in position must be avoided at all costs. In particular, it is also necessary to keep the suction distance between the pipette and the component within tight tolerances, in order to allow the components to be picked up and set down without them being subject to shocks.

The deformability of the known O-ring is so high that such levels of accuracy cannot be reliably achieved. In particular, the centrifugal force of the components which have been sucked on in the radial direction, which force occurs when the revolver head rotates, may result in the O-ring, which has been pressed, becoming detached.

SUMMARY OF THE INVENTION

The invention is based on the object of increasing the positional accuracy and the reliability of mounting. The invention achieves this object in an improvement in a pipette having a base body with a suction opening surrounded by an elastomeric bearing member that projects slightly above a surface of the base body. The improvement is the base body surrounds the bearing member on all sides without play, except for the side facing toward a component to be gripped or picked up.

As a result of the bearing member being supported on all sides in the base body, the bearing member cannot be deformed to such an extent and is held more securely in the base body. The lower deformability of the bearing member reduces the elastic deviation of the component which has been sucked on, so that this component can be fixed in a more accurate lateral and vertical position with respect to the pipette. Moreover, the fact that the bearing member is clamped inside the base body on all sides reduces the risk of a change in position being caused by rotation or by the bearing member being torn out.

As a result of the base body surrounding the bearing member without any cavities, the base body is clamped so securely in the inserted area that it can only be subjected to at most slight deformation at its free surface.

The cross section of the bearing member with a thick base part and a thin bearing rib to form the bearing surface enables the bearing rib to be extremely weak in cross section, while the remainder of the bearing member may be of a stronger a design. Such a bearing member can be produced and inserted more easily in terms of manufacturing technology. Due to its small height, the bearing rib is only slightly deformed yet can nevertheless adapt to unevenness or inclined positions of the component. The correspondingly narrow bearing surface against the component reduces the adhesive action to such an extent that the component no longer sticks to the pipette after its has been placed onto the printed circuit board.

The semi-circular or arc-shaped cross section produces a particularly narrow linear contact between the component and the bearing rib.

The refinement of the bearing surface projecting beyond the end surface or side of the base body, reliably avoids hard impacts when the component is placed onto the printed circuit board.

The refinement of the base part of the bearing member being cast or molded in a receiving groove of the base body; produces uniform deformation conditions over the entire extent of the bearing member which is, the example, annular. As a result of the bearing member being molded in the groove, a secure connection and a highly accurate arrangement are achieved.

The rectangular cross section of receiving groove can be produced easily by injection-molding means and produces good adhesion properties with respect to the elastomeric bearing member. These adhesion properties are increased if the base body is reinforced, for example with glass fibers, the ends of which project slightly into the receiving groove, thus making it more difficult for the molded-in bearing member to be torn out. The flush alignment of the outside with the base body results in an optimum support for the bearing rib.

The support member of the bearing member has the result of increasing the supporting force with increasing deformation, so that the bearing ribs are subjected to less deformation and the position deviations of the component with respect to the pipette, in particular the vertical position of the component, can be kept within tighter tolerances. Moreover, the lower support surfaces result in secure contact between a component and the bearing rib even if the component has a convex surface.

The refinement of the support member and bearing member being a single piece allows the support member to be produced in a single operation, together with the bearing member, without additional sprue points.

As a result of the refinement of the support member having structure and cross-section similar to the bearing member and extending within the space enclosed by the bearing member, the advantages of the design of the bearing member are also utilized by the support member, in particular with regard to the deformation and adhesion conditions.

The refinement of the support member extending inward from the annular bearing member like a radial spoke results in advantageous casting conditions, in which the support webs can easily be branched off from the bearing member.

The support ribs which slope obliquely downward fit optimally to, for example, a component with a convex suction face. Thus, as the pressure increases, a contact area which continuously grows in achieved without there being any possibility of leakage along the outer bearing rib.

The invention is explained in more detail below with reference to an exemplary embodiment which is illustrated in the drawing.

BRIEF DESCRIPTION OF THE DRAWINGS

FIG. 1 shows a view of an end side of a pipette for gripping electrical components, FIG. 2 shows a section through the pipette on line II/II in FIG. 1, together with an electrical component.

DESCRIPTION OF THE PREFERRED EMBODIMENTS

In accordance with FIGS. 1 and 2, a pipette 1 comprises a base body 2 and an elastomeric insert 3 which is inserted into an end side or surface 5, which faces toward an electrical component 4, of the rotationally symmetrical base body 2. The end side 5 of the pipette 1 can be placed onto the component 4 in the direction of the vertical arrow shown in FIG. 2. The base body 2 has a segmented, central suction opening 6 which leads all the way through to the end side 5 and is connected to a vacuum source of a mounting head (not shown) of a mounting machine for printed circuit boards. The base body 2 is provided with a holding ring 7 for attaching it to the mounting head.

The elastomeric insert 3 is formed as a single piece comprising an annular bearing member 8, which surrounds the suction opening 6, and support members 9, which extend in the form of spokes from the bearing member 8 toward the suction opening 6. The bearing member 8 and the support members 9 have ribs 10 and 11, respectively, which project slightly beyond the end side on surface 5 and are semi-circular in cross section. These ribs, together with a thicker, web-like base part 12, are cast into correspondingly designed receiving grooves, which are rectangular in cross section, of the base body.

The bearing rib 10 assigned to the bearing member 8 is in the form of a continuous ring. Half its width projects beyond the end surface 5. The support ribs 11 which are assigned to the support members 9 run in the form of spokes which slop obliquely downward toward the inside starting from the bearing rib 10. This means that they become increasingly active as the pressure on the component 4 increases. The inwardly decreasing height of the ribs 11 ensures that a component with a convex surface bears securely on the bearing rib 10 without any gaps being formed.

What is claimed is:

1. A pipette for gripping a component by means of a vacuum when mounting components on printed circuit boards, said pipette having a base body with a suction opening on an end surface of said body, which surface faces toward the component, a bearing surface on said end surface surrounding the opening in said end surface, said bearing surface forming part of an elastomer bearing member, which is mounted on the base body of the pipette and projects slightly beyond the end surface, the improvements comprising the base body of the pipette surrounding an inserted part of the bearing member, except for the side facing toward the component, without play and the bearing member having a base part which has a thick cross section and is surrounded on all sides by the base body, a thin bearing rib, which is smaller than the base part and forms the bearing surface, and at least one elastomeric support member with an end side support surface for an component being inserted onto the end surface of the base body, said support member having a bearing surface of a height less than a height of the bearing surface of said bearing member, the support member being joined to the bearing member as a single piece.

2. A pipette according to claim 1, wherein the base body surrounds the base part free of any cavity.

3. A pipette according to claim 1, wherein the bearing rib is curved in the shape of an arc in cross section and has a semi-circular design.

4. A pipette according to claim 1, wherein the bearing surface projects beyond the end surface to such an extent that the component does not touch the base body, even under full pressure.

5. A pipette according to claim 1, wherein the base body has at least one receiving groove for the base part of the bearing member and the base part of the bearing member being cast into the groove of the base body.

6. A pipette according to claim 5, wherein the receiving groove is rectangular in cross section and an outer end surface of the base part of the bearing member being approximately flush with the end surface of the base body with the bearing rib extending outwardly therefrom.

7. A pipette for gripping a component by means of a vacuum when mounting components on printed circuit boards, said pipette having a base body with a suction opening on an end surface of said body, which surface faces toward the component, a bearing surface on said end surface surrounding the opening in said end surface, said bearing surface forming part of an elastomer bearing member, which is mounted on the base body of the pipette and projects slightly beyond the end surface, the improvements comprising the base body of the pipette surrounding an inserted part of the bearing member, except for the side facing toward the component, without play and the bearing member having a base part which has a thick cross section and is surrounded on all sides by the base body, a thin bearing rib, which is smaller than the base part and forms the bearing surface, at least one elastomeric support member with an end side support surface for a component being inserted onto the end surface of the base body, said support member having a bearing surface of a height less than a height of the bearing surface of said bearing member, the support member being of a web-like design and having a cross section which is similar to the cross section of the bearing member and having at least one support rib, an outside of said support rib forming a support surface and the support member being arranged inside an area enclosed by the bearing rib of the bearing member.

8. A pipette according to claim 7, wherein the bearing member is an annular design and the support member forms a spoke-like support web which extends radially inward from the bearing member.

9. A pipette according to claim 8, wherein the support ribs of the support member slope obliquely downward toward the inside, starting adjacent the bearing ribs of the bearing member.

10. A pipette for gripping a component by means of a vacuum when mounting components on printed circuit boards, said pipette having a base body with a suction opening on an end surface of said body, which surface faces toward the component, a bearing surface on said end surface surrounding the opening in said end surface, said bearing surface forming part of an elastomer bearing member, which is mounted on the base body of the pipette and projects slightly beyond the end surface, the improvements comprising the base body of the pipette surrounding an inserted part of the bearing member, except for the side facing toward the component, without play and the bearing member having a base part which has a thick cross section and is surrounded on all sides by the base body, a thin bearing rib, which is smaller than the base part and forms the bearing surface, at least one elastomeric support member with an end side support surface for a component being inserted onto the end surface of the base body, said support member having a bearing surface of a height less than a height of the bearing surface of said bearing member, both the bearing member and the support member having a base part of a thick cross section with a thin bearing rib extending from a surface thereof, and the base body having a receiving groove for receiving the base part of both the bearing member and each support member.

11. A pipette according to claim 10, wherein the support member and bearing member are formed of a single piece.

12. A pipette according to claim 10, wherein the bearing member has a circular configuration and the support members extend radially inward toward the center of the bearing member.

* * * * *